(12) United States Patent
Aubert

(10) Patent No.: US 9,188,653 B2
(45) Date of Patent: Nov. 17, 2015

(54) PERMANENT MAGNET DEVICE FOR GENERATING AN OFFSET UNIFORM MAGNETIC FIELD

(75) Inventor: Guy Aubert, Poitiers (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 520 days.

(21) Appl. No.: 13/810,476

(22) PCT Filed: Jul. 13, 2011

(86) PCT No.: PCT/FR2011/051682
§ 371 (c)(1),
(2), (4) Date: Mar. 21, 2013

(87) PCT Pub. No.: WO2012/007695
PCT Pub. Date: Jan. 19, 2012

(65) Prior Publication Data
US 2013/0193973 A1    Aug. 1, 2013

(30) Foreign Application Priority Data
Jul. 16, 2010    (FR) ...................................... 10 55813

(51) Int. Cl.
*G01V 3/00*     (2006.01)
*G01R 33/383*   (2006.01)
*G01R 33/38*    (2006.01)
*H01F 7/02*     (2006.01)
*H01F 41/00*    (2006.01)

(52) U.S. Cl.
CPC .......... *G01R 33/383* (2013.01); *G01R 33/3802* (2013.01); *H01F 7/0278* (2013.01); *H01F 41/00* (2013.01); *Y10T 29/49826* (2015.01)

(58) Field of Classification Search
CPC ..................................................... G01R 33/383
USPC .......................... 324/320, 319; 335/302, 296
See application file for complete search history.

(56) References Cited

U.S. PATENT DOCUMENTS

| 5,014,032 A | 5/1991 | Aubert |
| 5,148,138 A * | 9/1992 | Miyata .......................... 335/302 |
| 5,332,971 A | 7/1994 | Aubert |

(Continued)

FOREIGN PATENT DOCUMENTS

EP    0541653 A1    5/1993

OTHER PUBLICATIONS

Halbach, Design of Permanent Multipole Magnets wtih Oriented Rare Earth Cobalt Material, Nuclear Instruments and Methods, 1980, 1-10, vol. 169.

(Continued)

*Primary Examiner* — Louis Arana
(74) *Attorney, Agent, or Firm* — The Webb Law Firm

(57) ABSTRACT

Disclosed is a device for generating a homogeneous magnetic field component Bz along an axis Oz in a spherical zone of interest of center O and radius r includes at least one first ring of axis Oz in magnetic material with radial magnetization oriented in a first direction and extending around an opening giving access to the zone of interest ZI, a second ring of axis Oz in magnetic material with radial magnetization oriented in the first direction and offset along axis Oz from the first ring and the zone of interest ZI, the inner radius and the outer radius of the second ring respectively being smaller than the inner radius and outer radius of the first ring.

16 Claims, 7 Drawing Sheets

(56) References Cited

U.S. PATENT DOCUMENTS

| | | | |
|---|---|---|---|
| 5,576,679 A | 11/1996 | Ohashi et al. | |
| 5,959,454 A * | 9/1999 | Westphal et al. | 324/320 |
| 6,150,911 A * | 11/2000 | Katznelson et al. | 335/299 |
| 8,773,230 B2 * | 7/2014 | Sakellariou et al. | 335/302 |
| 9,044,160 B2 * | 6/2015 | Knopp et al. | 1/1 |
| 2010/0231219 A1 * | 9/2010 | Manz et al. | 324/319 |

OTHER PUBLICATIONS

Hugon et al., Design of Arbitrarily Homogeneous Permanent Magnet Systems for NMR and MRI: Theory and Experimental Developments of a Simple Portable Magnet, Journal of Magentic Resonance, 2010, 75-85, vol. 205.

* cited by examiner

PERMANENT MAGNET DEVICE FOR GENERATING AN OFFSET UNIFORM MAGNETIC FIELD

FIELD OF THE INVENTION

The subject of the present invention is a permanent magnet device for creating an offset homogeneous field, which can be used in particular in the technique allowing the creation of images by nuclear magnetic resonance (NMR), this technique also being known under the name magnetic resonance imaging (MRI).

The invention also concerns a method for producing a said permanent magnet device.

PRIOR ART

MRI and NMR are based on the use of magnetic fields, including one so-called "main" magnetic field which must be as uniform as possible in the examined region or zone of interest ZI. Routine practice has given the term "homogeneous" to designate this uniform nature. This magnetic field of large homogeneity is generated by magnets, those most frequently used at the present time being superconducting coils which carry electric currents generating the field without any dissipation of energy, provided they are held at very low temperature. Said magnet device generally has the outer appearance of a cylindrical tunnel in which an object or the patient to be imaged is positioned. The geometric constraints for obtaining desired homogeneity within a certain volume lead to preferable positioning thereof in the centre of the tunnel and the length of this tunnel cannot be too small in relation to its diameter. Under these conditions, even if it is desired to build a machine dedicated to examination of the head (brain, sinus, dentition . . . ), the morphology of the human body is such that to place the head in the centre of the tunnel, the tunnel diameter must be sufficiently large to allow the passing of the shoulders and chest i.e. the entirety of the body. The machine is then said to be a "whole body" machine.

Since the cost of the magnet is roughly proportional to the cube of its diameter, the economic advantage can be appreciated of being able to produce a magnet whose volume of homogeneity encompasses the head without it being necessary to insert the shoulders. Such considerations are applicable to other types of use involving problems of required space when it is desired to produce a "dedicated" machine rather than a "general" machine that is much bigger and hence much more expensive.

Iron, cobalt and rare earth (neodymium, samarium . . . ) magnetic materials, whose industrial production started in the 1970s, allow so-called "permanent" magnets to be obtained which produce a sufficient magnetic field for NMR or MRI (although distinctly smaller than that of superconducting magnets) with the required qualities of homogeneity. These permanent magnets also have the advantage of much less cumbersome installation and operating constraints than "whole body" superconducting magnets and on this account can be installed more easily in medical practices.

However, as for superconducting magnets, the weight and cost of the magnet vary approximately as the cube of the dimensions thereof, and it is therefore of great advantage to be able to define configurations which are dedicated to only some investigations but of smaller dimensions than those of a "whole body" magnet.

The most remarkable property of the above-mentioned rare earth materials is that of rigidly maintaining the $\vec{M}$ magnetization imparted to them via a suitable magnetization process, for as long as the magnetic fields to which they themselves and their environment are subjected do not exceed certain limits (coercive field). Further details can be found in the following article on the use thereof and on one particular manner of magnetizing rings to produce a magnetic field globally perpendicular to their axis: "*Design of permanent multipole magnets with oriented rare earth cobalt material*", Klaus Halbach, Nucl. Instr. And Meth. 169, 1980, pp. 1-10.

The processes for producing materials for permanent magnets, in particular containing rare earths, must impart a large coercive field thereto and strong uniaxial anisotropy. These manufacturing processes are practically incompatible with radial magnetization of circular cylinder rings. It has therefore been proposed to replace these ring-shaped circular cylinders by an assembly of N identical right prisms, of isosceles trapezoidal section to form a polygonal ring.

From document EP 0 541 653 B1 for example a permanent magnet is known for nuclear magnetic resonance which uses rings with radial magnetization in a configuration having symmetry relative to a median plane xOy perpendicular to their axis Oz. The region of interest with homogeneous field is then accessible perpendicular to the axis in the vicinity of this plane. The structure essentially comprises two large rings symmetrical relative to the median plane, magnetized radially in opposite direction, homogeneity being obtained by means of an assembly of smaller rings, also having symmetry relative to the median plane, with radial or axial magnetizations. It can be seen that in said structure, the examination of any part of the human body requires that the distance between the two ring assemblies positioned either side of the median plane should be sufficiently wide to allow the passing of the whole body. Said permanent magnet device does not therefore meet the requirements relating to a compact device of easy manufacture capable of creating a homogeneous magnetic field for the observation in particular of a dedicated part of the human body (e.g. sinus, brain, jaw, breast, etc.) without the need to make provision for a large size allowing the passing of an entire human body.

DEFINITION AND SUBJECT OF THE INVENTION

The present invention sets out to overcome the aforementioned disadvantages and to allow a permanent magnet device to be obtained for creating an offset homogeneous magnetic field that is more compact than existing devices whilst being easy to produce, and with which it is possible to obtain an intense, very homogeneous magnetic field in a volume of interest and having particular use in NMR or MRI applications intended to examine dedicated parts of an object or of the human body (e.g. brain, jaw, sinus, breast, . . . ).

By intense magnetic field is meant a magnetic field of at least 0.5 T, preferably of 1 T or higher, and which in some embodiments may exceed 10 T.

The invention also sets out to define a method for producing a said device which is simplified but which nevertheless allows optimized homogenization of the magnetic field produced in the volume of interest.

These objectives are achieved according to the invention by means of a permanent magnet device for creating a homogeneous magnetic field to generate a homogeneous magnetic field component Bz along an axis Oz in a spherical zone of interest ZI of centre O and radius r, characterized in that it comprises at least one main annular ring in magnetic material with radial magnetization oriented in a first direction, having said axis Oz, a first inner radius, a first outer radius and extending around an access opening to said zone of interest ZI, a second main annular ring in magnetic material with radial magnetization oriented in said first direction, having said axis Oz, a second inner radius, a second outer radius and offset along said axis Oz relative to said first ring and said zone of interest ZI, the second inner radius and the second outer radius of the second main ring respectively being smaller than the first inner radius and the first outer radius of the first main ring, and a cylindrical corrector assembly of axis Oz arranged between the first main ring and the zone of interest ZI and between the second main ring and the zone of interest ZI and comprising—starting from the vicinity of said opening—at least one first supplementary annular ring in magnetic material with radial magnetization oriented in opposite direction to said first direction, and at least one second supplementary annular ring in magnetic material with radial magnetization oriented in said first direction, and in that the superimposed supplementary rings forming said cylindrical corrector assembly have the same inner radius which is equal to the second inner radius of the second main annular ring and the same outer radius which is smaller than the first inner radius of the first main annular ring.

The permanent magnet device may further comprise an annular corrector ring of axis Oz in magnetic material with radial magnetization oriented in a direction opposite said first direction, arranged between said first main annular ring and said cylindrical corrector assembly.

According to one particular embodiment, the cylindrical corrector assembly comprises six superimposed supplementary rings in magnetic material with radial magnetization which, for each successive supplementary ring, is oriented alternately in opposite direction to said first direction and in said first direction.

To facilitate manufacture, the cylindrical corrector assembly may also comprise intercalary rings in non-magnetic material to adjust the spacing between the superimposed supplementary rings in magnetic material with radial magnetization which, for each successive supplementary ring, is oriented alternately in opposite direction to said first direction and in said first direction.

According to one particular aspect of the invention, at least some of the annular rings in magnetic material are formed by polygonal rings defined by circular cylinders approximated by polygonal lines and formed from an assembly of N identical right prisms having an isosceles trapezoidal base.

In this case, according to one particular embodiment, the first and second main rings may be formed by polygonal rings comprising 8, 10 or 12 identical right prisms having an isosceles trapezoidal base.

The permanent magnet device of the invention can be applied to a NMR installation and can be in the form of a top hat comprising a rim defining an opening and a cylindrical chimney of axis Oz extending said opening and defining an inner cavity to allow analysis of the head or part of a head of a patient.

This device in the form of a top hat can be installed vertically with the opening positioned at the bottom.

It can also be installed in horizontal position with the opening positioned laterally.

The permanent magnet device of the invention can also be applied to a MRI mammography installation and can be in the form of an inverted top hat comprising a rim defining an upper opening and a cylindrical well of axis Oz extending said opening and defining an inner cavity to allow the analysis of a patient's breast or part of a breast.

The permanent magnet device of the invention can be in fixed position and arranged facing a support to carry an object or a patient and which can be moved relative to said permanent magnet device to bring the object or organ of a patient along the axis Oz into said spherical zone of interest ZI.

According to one particular embodiment, a free space at the centre of said second main annular ring is shut off at least in part by an additional cylindrical block in magnetic material with radial or axial magnetization.

The invention also concerns a method for producing a permanent magnet device for the creation of a homogeneous magnetic field with the generation of a homogeneous magnetic field component Bz along an axis Oz in a spherical zone of interest ZI of centre O and radius r, characterized in that it comprises the following steps:

a) preparing and positioning at least one first main annular ring in magnetic material with radial magnetization oriented in a first direction, having said axis Oz, a first inner radius, a first outer radius and extending around an access opening to said zone of interest ZI, b) preparing and positioning a second main annular ring in magnetic material with radial magnetization oriented in said first direction, having said axis Oz, a second inner radius, a second outer radius and offset along said axis Oz relative to said first annular ring and said zone of interest ZI, the second inner radius and the second outer radius of the second main annular ring respectively being smaller than the first inner radius and the first outer radius of the first main ring, and c) preparing and positioning a cylindrical corrector assembly of axis Oz arranged between the first main annular ring and the zone of interest ZI and between the second main annular ring and the zone of interest ZI and comprising—starting from the vicinity of said opening—at least one first supplementary annular ring in magnetic material with radial magnetization oriented in opposite direction to said first direction, and at least one second supplementary annular ring in magnetic material with radial magnetization oriented in said first direction, the superimposed supplementary rings forming said cylindrical corrector assembly having the same inner radius which is equal to the second inner radius of the second main annular ring and the same outer radius which is smaller than the first inner radius of the first main annular ring.

To adjust the spacing between the supplementary rings, it is possible to intercalate intercalary rings in non-magnetic material within the cylindrical corrector assembly.

According to the invention, at least some of the annular rings in magnetic material can be made in the form of polygonal rings defined by circular cylinders approximated by polygonal lines and formed from an assembly of N identical right prisms having an isosceles trapezoidal base.

The forming of a polygonal ring can be obtained using the following steps:
i) forming parallelepiped blocks by pressing or sintering, having a priority magnetization direction;
ii) cutting the parallelepiped blocks in the de-magnetized state to create prisms;
iii) magnetizing each of the prisms in the desired direction;
iv) assembling and bonding the prisms to create a polygonal ring.

BRIEF DESCRIPTION OF THE DRAWINGS

Other characteristics and advantages of the invention will become apparent from the following description of particular embodiments of the invention given as examples with reference to the appended drawings in which.

DETAILED DESCRIPTION OF PREFERRED EMBODIMENTS

The present invention sets out in particular to solve the problem of producing a permanent magnet configuration dedicated to the examination of a particular organ, such as a patient's head, without it being necessary to place the patient's entire body in the machine, for the purpose of reducing the size of the magnet device. The solution proposed by the present invention can also be used in other circumstances in which difficulties of access or required volume may arise. This is the case for example with MRI mammography, as will be explained below, only one breast of a patient lying face down can be the subject of analysis in a magnetic field by means of a device of the invention, without it being necessary to place the patient's entire body in a tunnel-shaped observation machine.

To illustrate the general form of a device according to the invention, consideration can be given to the shape of a top hat.

Figure 11:
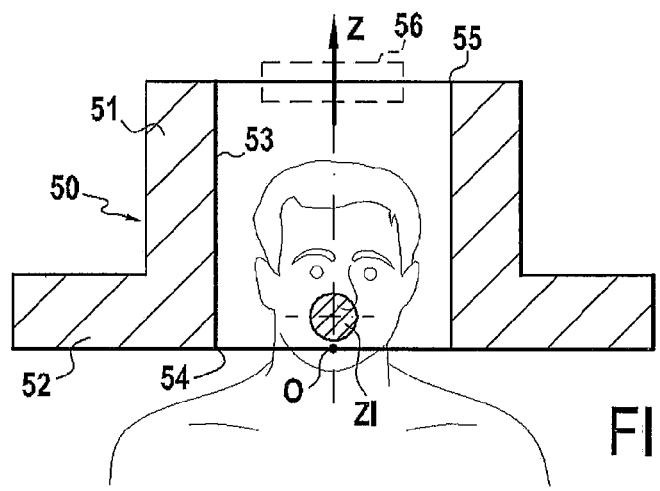
FIGS. 11 and 12 are schematic, axial sectional views illustrating examples of application of the device of the invention to a NMR installation for observation of a patient's head.

If a hat of much larger size than the patient's head is chosen, such that it is possible to fit it as far down as the shoulders of this patient, a device is obtained such as the device 50 in FIG. 11 with a cylindrical body 51 defining an inner volume 53 of axis Oz with an opening 54 at its lower part extended by a rim 52 able to lie just above the patient's shoulders whose head is engaged in the zone of interest formed in the cavity 53. The bottom of the cavity 53 can be shut off by a block 56 or on the contrary, in some embodiments, this block 56 can advantageously be removed to form an opening 55 providing an access via the top to allow the arranging of elements needed for MRI (RF antenna, gradient coils . . . ) inside the hat, around the patient's head. The entire space symbolized by the hat 50 and the rim 52 is able to receive magnetized parts intended to produce a homogeneous magnetic field along axis Oz within a certain effective volume e.g. a zone of interest encompassing a jaw if a jaw is to be imaged. This is the condition that is the most difficult to achieve since this is the head region the closest to the shoulders. If homogeneity is to be obtained in this region, it is sufficient in order to examine the sinus or brain to lift up the hat or, if it is held by suitable supports, to lower the patient.

According to the invention, magnetized parts are used formed of coaxial annular rings around the vertical axis Oz of the hat 50. Each ring is limited by an inner circular cylinder of radius $a_1$, an outer circular cylinder of radius $a_2$ and two planes perpendicular to the axis, separated by the height h of the ring.

A said element geometrically characterized by the three parameters $(a_1, a_2, h)$ will simply be called a "ring" and all that needs to be specified is the magnetization status thereof.

In addition to magnetization of "Halbach dipole" type, it can be envisaged to magnetize the ring either parallel to its axis (axial magnetization) or perpendicular to its axis (radial magnetization). In the present invention consideration is given to radial magnetization that is best adapted to the desired result, except with regard to a possible bottom 56 of the cavity 53 where magnetization could be axial or radial accordingly.

It is assumed here that the proposed magnetizations are perfectly rigid. In actual situations, they may evidently lie slightly away from this theoretical rigidity on account of material imperfections for example, or of errors during the magnetization process, local de-magnetizations . . . . As for any type of real magnet, including superconducting magnets, the magnetized rings used in the present invention may be subjected to final adjustment corrections using appropriate adjustment devices known as shims.

The magnetic properties of rings with radial magnetization are recalled below:

Let a ring be considered, geometrically defined by the four parameters $(a_1, a_2, b_1, b_2)$, where $a_1$ and $a_2$ respectively designate the inner radius and the outer radius of the circular cylinders delimiting the ring in a plane perpendicular to the axis Oz, and the height of the ring along axis Oz is given by $h = b_2 - b_1$ where $b_1$ and $b_2 > b_1$ are the dimensions along axis oz of the planes which limit the ring in this direction.

It is easily shown that if the ring carries radial magnetization of constant modulus $M = |\vec{M}|$, on its axis at dimensional point z it produces a magnetic field that is parallel to this axis, whose algebraic measurement has the expression:

$$B_z = \pm \frac{\mu_0 M}{2} \left[ \left[ \frac{a}{\sqrt{a^2 + (b-z)^2}} - \operatorname{arctanh} \frac{a}{\sqrt{a^2 + (b-z)^2}} \right]_{a_1}^{a_2} \right]_{b_1}^{b_2}$$

where the + sign corresponds to radial magnetization directed from the axis towards the outside and the − sign to radial magnetization directed towards the axis.

If, as an example, the relationship $$\frac{B_z}{\mu_0 M} = f\left(\zeta = \frac{z}{a_1}\right)$$

is considered for radial magnetization directed towards the axis with $$a_2 = 2a_1, \ b_2 = -b_1 = \frac{a_1}{2}, \ h = a_1,$$

it can be seen that the magnetic field is zero in the centre of the ring (f is an odd function of $\zeta$) and passes through a maximum, $$\frac{B_0}{\mu_0 M} \approx 0.1836,$$

distant from the centre, $\zeta_0 = 0.7845$, which is precisely one of the aspects it is sought to obtain.

Around this point offset along the axis Oz, there is therefore an approximately homogeneous zone in which NMR and MRI can be performed on a sufficiently small sample portion for the required homogeneity conditions to be met.

It is to be noted that for rare earth materials, for example FeNdB, $\mu_0 M \approx 1.2$ T approx. It can therefore be expected with these permanent magnets to obtain fields of about 0.1 to 0.2 T i.e. fields of the order of those which were used before the introduction of superconducting coils and which already allowed the obtaining of images of fully satisfactory quality for medical use.

According to the invention, an optimization process is carried out which entails identifying the geometry and axial positions, i.e. $(a_1, a_2, b_1, b_2)$, of an assembly of such radially magnetized rings, with the $\pm$ sign to be determined for each thereof, located in the above-defined free space, such that the field produced at a point on the axis Oz of given position relative to the rim of the hat (distance to the shoulders) is the largest possible for a fixed volume of magnetized material (or in equivalent manner, a minimum volume of material for a fixed field), whilst paying heed to fixed homogeneity in a sphere also of fixed radius centred on this point.

This raises a conventional problem of non-linear optimization both regarding the objective function (volume of material or value of the magnetic field) and regarding constraints, homogeneity in particular, with limits on the geometric variables to observe spatial constraints. However, consideration must be given to the fact that radial magnetization is not a continuous function able to vary between $\pm M$ but is only able to assume one or other of the end values.

For example, it can be sought to determine which geometry of a single ring will give the maximum magnetic field at the maximum point on the axis Oz, i.e. $B_0 = B_z(\zeta_0)$, for a volume $V = \pi h(a_2^2 - a_1^2)$ without any other constraint. $B_0$ is evidently an increasing function of V but whereas the magnetizing energy involved is proportional to V, the effective magnetic energy created is proportional to $B_0^2 a_1^3$. There must therefore exist an economic optimum which corresponds to the maximum of $$\frac{B_0^2 a_1^3}{V}.$$

The solution is then entirely determined to within the $a_1$ geometric scale factor.

It can therefore be noted that it is a remarkable property of permanent magnet configurations that their magnetic properties are invariant when they are dilated (or contracted) by a scale factor. It is therefore possible to adjust the actual dimensions in fine to obtain the necessary free space without having to perform further computing.

Via numerical solving of non-linear equations of the problem, the following result is obtained for this economic optimum:

$$\frac{a_2}{a_1} \approx 1.7694, \ \frac{h}{a_1} \approx 1.6338, \ \frac{\zeta_0}{a_1} \approx 0.9508, \ \frac{B_0}{\mu_0 M} \approx 0.2169,$$

With a single ring, the homogeneity zone is indeed offset to outside the ring but it is very small relative to the dimensions of the magnet. The zone of interest with a field sufficiently homogeneous for MRI can therefore be a sphere of radius $$\frac{a_1}{10}$$

To increase the size of the homogeneity zone, a more precise mathematical definition can be given of the conditions to be met to obtain homogeneity:

In a "magnetically" empty region of the space (i.e. containing neither electric current nor magnetized material), the Laplacian of each of the Cartesian components of the magnetic field is zero, which implies that each of these components can be expanded in solid spherical harmonics (ESH) in the form, for component $B_z$ for example:

$$B_z = Z_0 + \sum_{n=1}^{\infty} r^n \left[ Z_n P_n(\cos\vartheta) + \sum_{m=1}^{n} (X_n^m \cos m\varphi + Y_n^m \sin m\varphi) P_n^m(\cos\vartheta) \right]$$

where $(r, \theta, \varphi)$ are the spherical coordinates of the point under consideration in a reference frame of axis Oz such that $z = r \cos\theta$ with $x = r \sin\theta \cos\varphi$ and $y = r \sin\theta \sin\varphi$. The $P_n$ terms are Legendre polynomials of n degree and the $P_n^m$ terms are the associated Legendre polynomials of n degree and of order m. This expansion is unique and valid inside the largest magnetically empty sphere of centre O.

If the configuration of the field sources is axisymmetric of axis Oz, the following simple form is obtained:

$$B_z = Z_0 + \sum_{n=1}^{\infty} r^n Z_n P_n(\cos\vartheta)$$

It is the appropriate form for an assembly of coaxial rings of axis oz with radial magnetization. It is reduced to an even simpler form for $B_z(z)$ on the axis, i.e.:

$$B_z = Z_0 + \sum_{n=1}^{\infty} Z_n z^n$$

The $Z_n$ terms can therefore be obtained from the expansion in series of the analytical expression of the field created on the axis by each of the rings. It is also possible to establish a recurrence relationship which allows rapid calculation of the successive coefficients starting from the two first, $Z_1$ and $Z_2$.

The conditions for homogeneity will therefore assume the mathematical form of cancellation of the $n_0$ first coefficients, i.e.:

$$Z_1 = Z_2 = L = Z_{n_0} = 0$$

If these conditions are met, it is said that the magnet is homogeneous to the $n_0$ degree (or also order). Since the remaining coefficients are decreasing functions of their degree, the inhomogeneity of the magnet will chiefly be governed by the first nonzero term following after $n_0$. Although the calculation was only performed on the axis, the fact that the $Z_n$ coefficients are those of the ESH valid within its entire sphere of validity, guarantees firstly the homogeneity of $B_z$ in the sphere, whether or not positioned on the axis, and secondly that the perpendicular components of the field are of the same order of magnitude as the inhomogeneous part of $B_z$. They therefore do not have any influence on the field modulus which gives the NMR frequency and which can be considered to be equal to $B_z$.

In the configurations which have a plane of symmetry perpendicular to the axis and if this plane is chosen to be xOy (O is a centre of symmetry for the magnet), all the coefficients of odd degree $Z_{2p+1}$ are identically zero on account of symmetry. This is unfortunately not the case for the asymmetrical configurations considered here and all the successive terms must then be explicitly cancelled.

For example, with a single ring as indicated above, if the origin is chosen at $\zeta_0$ for ESH, the fact that this point is a maximum of $B_z$ corresponds to $Z_1=0$ and it is the following nonzero coefficients $Z_2, Z_3, K$ which govern inhomogeneity. If a second ring is included symmetrical relative to this point (its magnetization will therefore be of opposite sign to that of the first) it can be seen that not only is the value of the field doubled but homogeneity is strongly improved since the first nonzero terms are now $Z_4, Z_6, K$ In addition to the homogeneous field produced in the volume of interest, any magnet produces an external field also called a "stray field". This field has harmful influences, in particular on electric or electronic appliances such as pacemakers, which has led to defining a legal safety limit of 5 gauss=50 mT over and above which special precautions must be taken with total interdiction for wearers of pacemakers in particular.

As for the inside where so-called "regular" ESHs exist, on the outside of the smallest magnetically empty sphere (i.e. a sphere encompassing the entirety of the magnet) there exist ESHs for the field components that are so-called "irregular" ESHs. They are in $$\frac{1}{r^{n+1}}$$

instead of $r^n$, with $M_n$ terms as axial coefficients instead of $Z_n$. These coefficients are called "moments" and the moment of lowest degree is the dipole moment $M_2$ since magnetic monopolies do not exist (at least in this context).

The methods for reducing the external field are similar to those used for homogenization and entail cancelling of the successive moments, most often with restriction to $M_2=0$, whilst simultaneously cancelling the $n_0$ first $Z_n$ terms starting from n=1 to obtain the desired homogeneity.

One characteristic of considerable interest displayed by rings with radial magnetization is that their dipole moment is identically zero, which therefore reduces the external field without any particular effort.

To take the foregoing into account, according to the invention several coaxial rings with radial magnetization are used whose magnetization is oriented in a predefined direction.

Also, the manufacturing processes of materials for permanent magnets, in particular rare earth magnets, must impart thereto a large coercive field and strong uniaxial anisotropy. These processes may have incompatibilities with the radial magnetization of the rings. This is why according to one aspect of the invention, to facilitate manufacture, the annular circular cylinders are replaced by an assembly of N identical right prisms of isosceles trapezoidal section to form a polygonal ring.

The inner and outer apexes of the prisms are located on circular cylinders of axis Oz of radii $a_1$ and $a_2 > a_1$ respectively. The prisms are located between the planes perpendicular to Oz of dimensions $b_1$ and $b_2 > b_1$. Their angle aperture is $$2\varphi_0 = \frac{2\pi}{N}.$$

Each prism has uniform magnetization $\vec{M} = M \vec{u}_\perp$ perpendicular to the axis Oz and following the bisector of the angle aperture of each prism i.e. perpendicular to the two inner and outer rectangular faces, oriented from inside to outside or conversely. First the expression of the axial component of the field on the axis is determined:

$$B_z(\rho=0, z) = \{\{f[a,(b-z)]\}_{a_1}^{a_2}\}_{b_1}^{b_2}.$$

The axial coefficients $Z_n$ of the ESH of component $B_z$ are inferred therefrom by the equations:

$$Z_0 = B_z(\rho=0, z=0) = \left[[f(a,b)]_{a_1}^{a_2}\right]_{b_1}^{b_2}$$

$$Z_n = -\frac{1}{n}\left[\left[\frac{\partial Z_{n-1}}{\partial b}\right]_{a_1}^{a_2}\right]_{b_1}^{b_2}$$

The first non-axial terms resulting from this segmentation are much more difficult to calculate but they only occur at order N which solely needs to be taken sufficiently large so that the search for homogeneity only relates to the axial terms.

Conventional magnetostatic calculation leads to the following expression:

$$B_z(\rho=0, z) =$$

$$\pm N \frac{\mu_0 M}{2\pi} \left[\left[\text{arctanh}\frac{a \sin\varphi_0}{\sqrt{a^2+(b-z)^2}} - \sin\varphi_0 \text{arctanh}\frac{a}{\sqrt{a^2+(b-z)^2}}\right]_{a_1}^{a_2}\right]_{b_1}^{b_2}$$

where the + sign corresponds to radial magnetization directed from the axis towards the outside and the − sign to radial magnetization directed towards the axis.

The following is inferred therefrom:

$$Z_0 = \pm N \frac{\mu_0 M}{2\pi} \left[ \left[ \text{arctanh} \frac{a \sin \varphi_0}{\sqrt{a^2+b^2}} - \sin\varphi_0 \text{arctanh} \frac{a}{\sqrt{a^2+b^2}} \right]_{a_1}^{a_2} \right]_{b_1}^{b_2}$$

It is then verified that if $N \to \infty$ with $$\varphi_0 = \frac{\pi}{N}$$

the expressions obtained for the annular cylinder are indeed found:

$$B_z = \pm \frac{\mu_0 M}{2} \left[ \left[ \frac{a}{\sqrt{a^2+(b-z)^2}} - \text{arctanh} \frac{a}{\sqrt{a^2+(b-z)^2}} \right]_{a_1}^{a_2} \right]_{b_1}^{b_2}$$

$$Z_0 = \pm \frac{\mu_0 M}{2} \left[ \left[ \frac{a}{\sqrt{a^2+b^2}} - \text{arctanh} \frac{a}{\sqrt{a^2+b^2}} \right]_{a_1}^{a_2} \right]_{b_1}^{b_2}$$

The homogeneity calculations for the polygonal rings are therefore very similar to those performed for the circular rings. In practice, the configuration is determined with circular rings, and then it is slightly modified at a last step using the expressions relating to polygonal rings.

Figure 10:
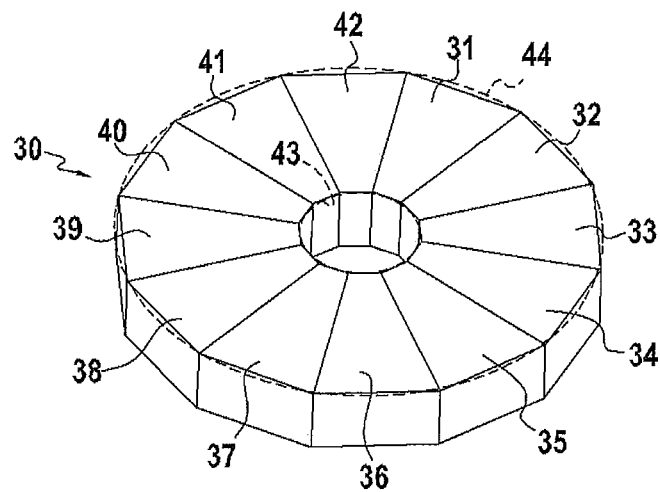
FIG. 10 is a plan view of an example of polygonal ring which can be used in the permanent magnet device of the invention.

FIG. 10 shows a plan view perpendicular to the axis of an example of a polygonal ring 30 with N=12, $$\frac{a_2}{a_1} = 4$$

(radii of circles 43, 44) and a total height h=2.

In this example of embodiment, the polygonal ring 30 approximating a cylindrical ring therefore comprises twelve constituent elements 31 to 42 formed by identical right prisms of isosceles trapezoidal section. The number N may evidently be different from twelve and may be eight or ten for example.

According to the invention, the asymmetrical magnet device may therefore advantageously be produced in fine by means of polygonal rings, typically dodecagonal, but it is also possible to be limited to octagons. In the remainder hereof the polygonal rings shall simply be designated as "rings" and shall be illustrated as circular.

It was already seen in the foregoing that it is possible, with a single ring, to obtain a homogeneity region that is distinctly offset from the centre of the ring, but this homogeneity region proves to be too small in practice. This is why, according to the invention, several rings are provided of same axis Oz with radial magnetizations in one or other of the two possible directions such that the $n_0$ first $Z_n$ of the regular ESH after n=1 are zero, so as to increase most substantially the dimensions of the homogeneity region. As seen above, the magnetic properties of these permanent magnet configurations are maintained within a homothetic transformation of any ratio. It is therefore sufficient to determine the structure for a unit free inner radius and then to perform the homothecy needed to obtain the desired values of the actual free radius $a_1$, of the size of the homogenous region and of the offset thereof from the edge of the structure.

The proposed configuration therefore only depends on three parameters, for a radius $a_1=1$, the value of the magnetic field at the centre O of the region of interest relating to the magnetization of the material used i.e.

$$\frac{B_0}{\mu_0 M},$$

the $n_0$ degree of homogeneity such that $Z_1=Z_2=L=Z_{n_0}=0$ from which the dimensions of the homogeneous region will be inferred to within x ppm, the dimension $\beta_0$ of the plane limiting the region of the space taken up by the magnets i.e. the region $\zeta \geq \beta_0$. The minimum volume $V_0$ of material needed under these conditions is a function $$V_0 \left( \frac{B_0}{\mu_0 M}, n_0, \beta_0 \right),$$

which is an increasing function of the first two parameters and a decreasing function of the third. In other words, the volume of material and hence the cost of the magnet increases with the field and the degree of homogeneity and with the distancing of the homogeneous region from the region occupied by the magnets. Evidently, beyond certain values of these parameters, there is no longer any solution. The actual volume of material will be $V_0 a_1^3$, once the actual radius $a_1$ is chosen.

To obtain a region of homogeneity to within x ppm of given dimensions, the choice having regard to the homothecy property is between increasing $a_1$ and increasing $n_0$ for a radius $a_1$ furthermore sufficient to provide the desired access and offset $\beta_0 a_1$. It is always much more economical to increase $n_0$, which leads to a more complex structure but of smaller volume.

Depending on the values chosen for the parameters, the optimization process leads to a wide variety of configurations of which the example illustrated below in FIGS. 1 and 1A allows the defining of the common characteristics of the invention. They correspond to the following a priori fixed values of the parameters:

$$\frac{B_0}{\mu_0 M} = 0.09$$

$$n_0 = 7$$

$$\beta_0 = -0.25$$

The value of the actual field obtained with FeNdB will therefore exceed 0.1 T=1000 gauss, the value needed to obtain images of sufficient quality. $n_0=7$ is already a high degree of homogeneity compatible with rings that are at least octagonal and which will give non-axial terms of inhomogeneity on and after degree 8. If $a_1=0.3$ m is chosen so as to have a free diameter of 60 cm to "house" the head, the gradient coils and the antennas, the result will be $\beta_0 a_1=-7.5$ cm, which places the centre of the zone of interest ZI at the lower jaw, if the edge of the hat touches the shoulders. The diameter of the theoretical sphere of homogeneity at 10 ppm obtained under these conditions is about 15 cm as shown by the curves in FIGS. 2 and 3. Optimization of the structure leads to $V_0=16.198$, i.e. 0.437 m³ of material for the chosen free diameter.

Figure 1:
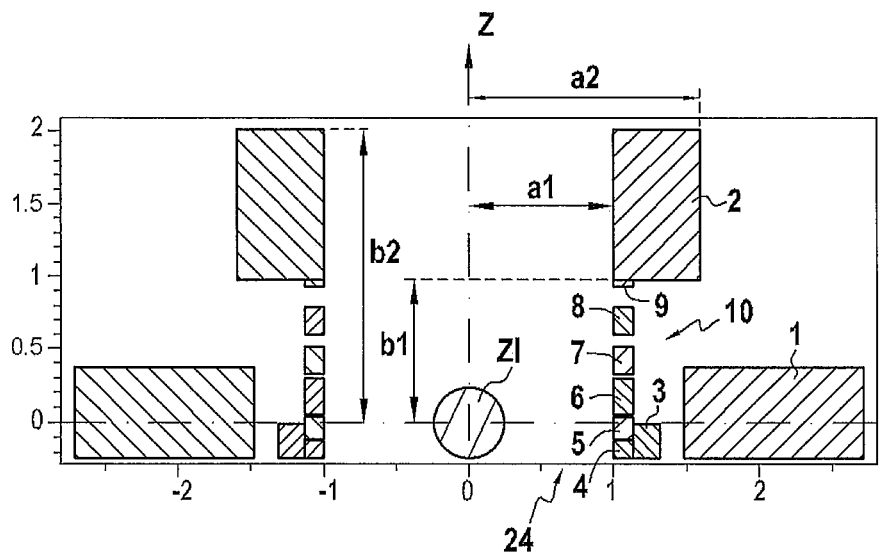
FIG. 1 is a schematic, axial sectional view of one particular embodiment of a permanent magnet device according to the invention with a six-element corrector casing.

FIG. 1 shows a section passing through axis Oz of the structure with a free access 24 of unit radius. The sphere of homogeneity at 10 ppm forming the zone of interest ZI has a radius of 0.25 and therefore extends as far as the lower limit of the structure ($\beta_0 = -0.25$). The different rings have radial magnetizations of different direction, for example from the axis to outside and towards the axis for a resulting magnetic field Bz directed in the upward vertical direction.

Figure 1A:
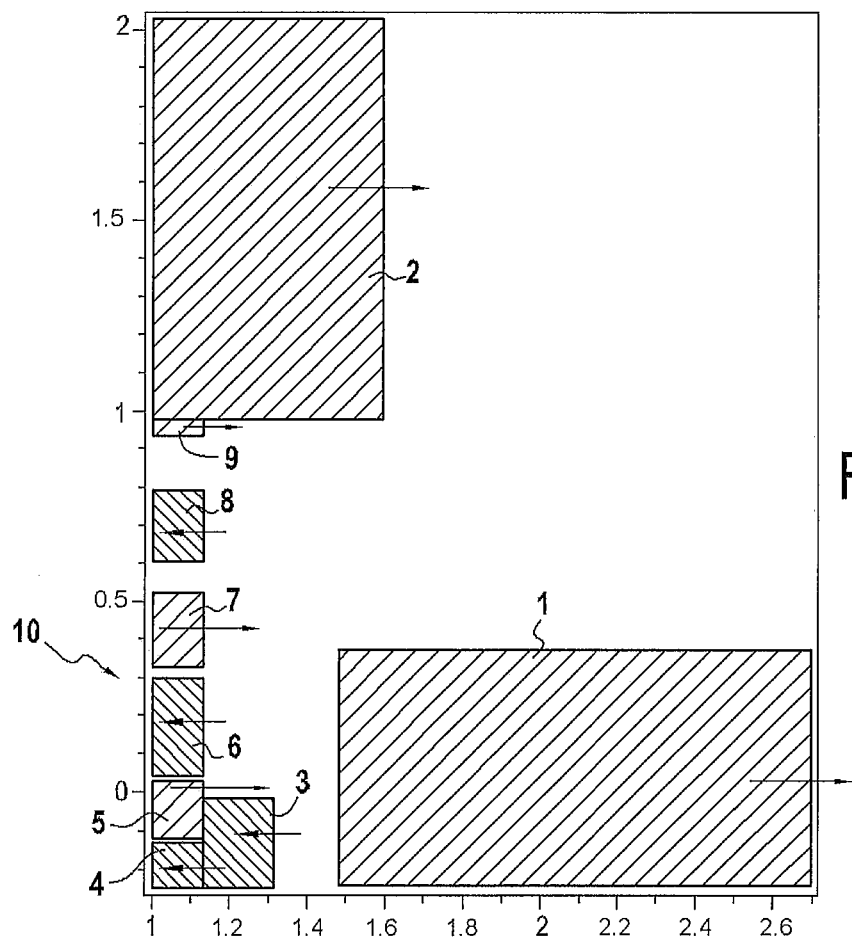
FIG. 1A is an axial, half-sectional magnified view of FIG. 1.

Although the dimensions of the rings vary in relation to the choice of parameters, the following elements are found as illustrated in FIG. 1A which is a magnified view of the right side of the section in FIG. 1:

i) two main rings 1 and 2 magnetized in the same direction, unlike the main rings of the symmetrical structure in the prior art formed by document EP 0 541 653 B1. The ring 1 is "pressed against" the lower fixed limit, and the ring 2 lies higher up, "pressed against" the free inner radius. With only these two main rings 1 and 2, it is not possible to exceed the degree of homogeneity $n_0 = 3$ whereas a single ring allows $n_0 = 2$ as recalled above;

ii) a certain number of rings 4 to 9 of alternate magnetizations, following after each other with variable thicknesses and spacing resulting from computing. The number of rings required increases with $n_0$. Their inner radius is the limit unit radius and for reasons of simplicity of construction, the same outer radius is imposed thereupon to form a kind of "casing of corrector rings" 10 which can easily be dismounted to modify the spacing between rings if the mapping of the magnet formed so requires. It is also possible to form this casing with geometrically identical rings, magnetized in one direction or the other, of fairly narrow thickness to obtain the desired structure by stacking them with non-magnetic rings machined to the desired thickness;

iii) for $n_0 > 5$ or 6 depending on the values of the other parameters, it is necessary to add an additional ring 3, magnetized in opposite direction to the main rings 1 and 2 and whose lower dimension is limited by $\beta_0$ and whose inner radius is limited by the outer radius of the preceding casing 10.

Figure 2:
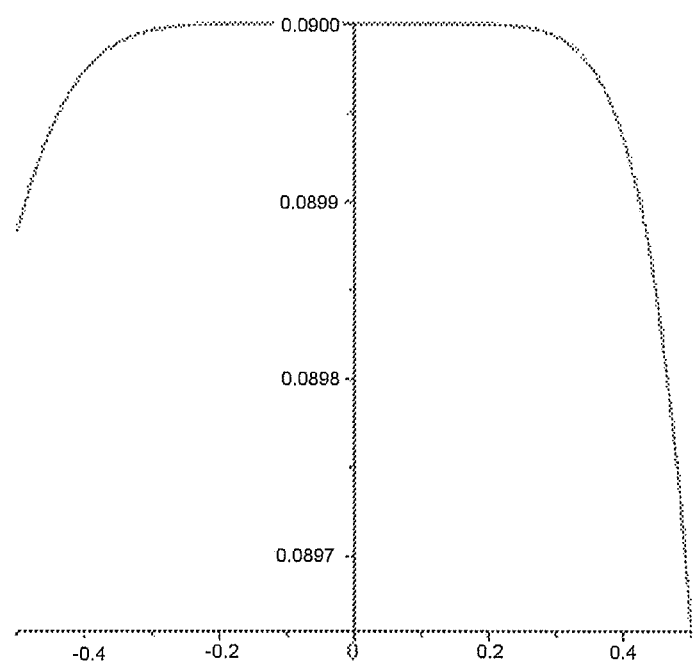
FIG. 2 shows the variation in the reduced magnetic field as a function of reduced dimension for the embodiment in FIGS. 1 and 1A.
Figure 3:
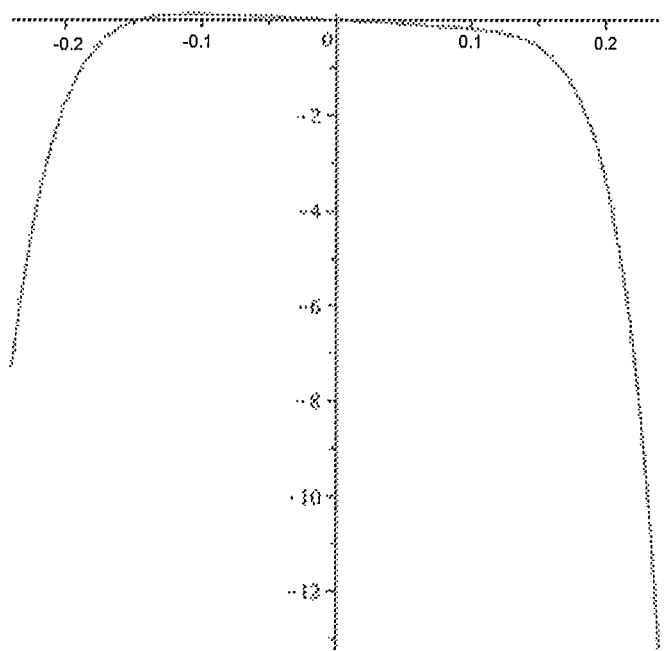
FIG. 3 shows the homogeneity of the magnetic field in ppm as a function of reduced dimension for the embodiment in FIGS. 1 and 1A.

FIGS. 2 and 3 respectively show the variation in the reduced field and homogeneity in ppm as a function of the reduced dimension $\zeta$.

Figure 4:
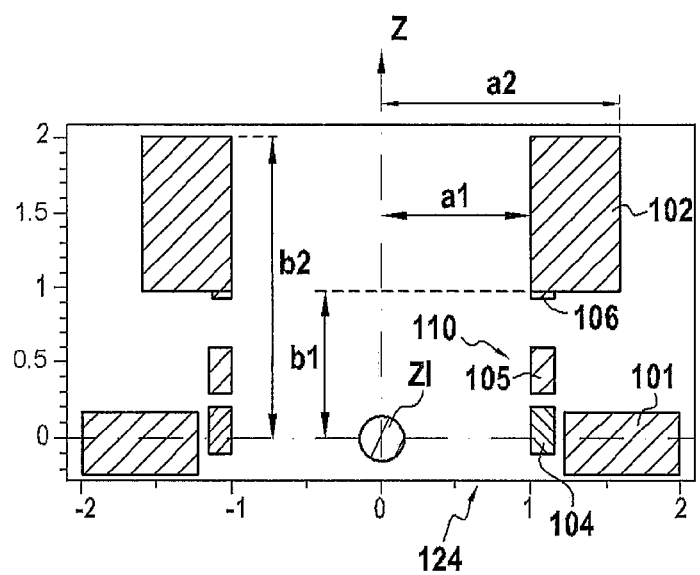
FIG. 4 is a schematic, axial sectional view of one particular embodiment of a permanent magnet device according to the invention with a three-element corrector casing.
Figure 4A:
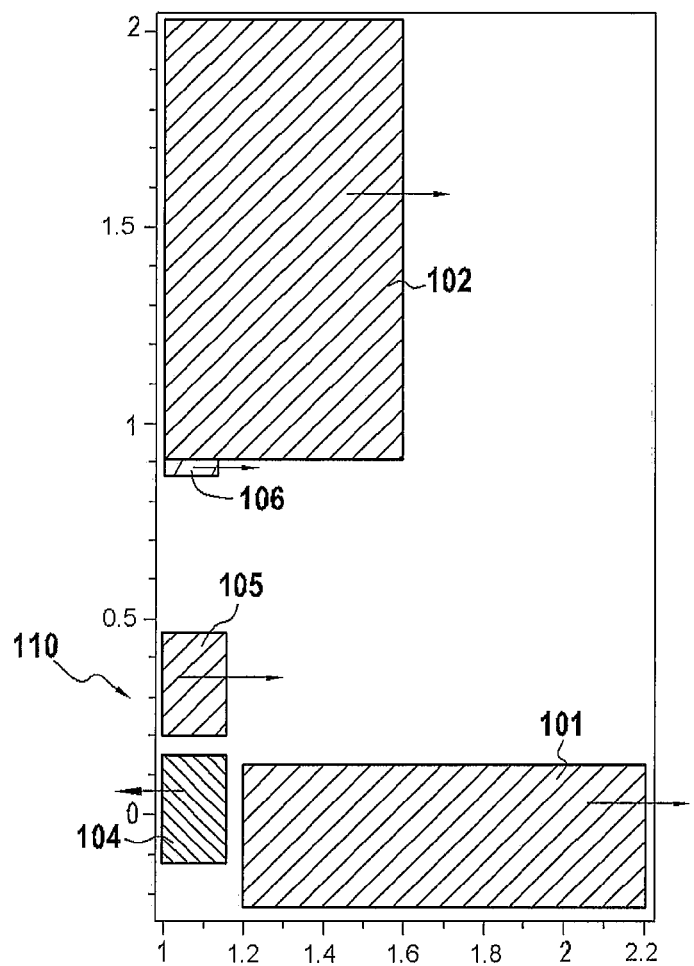
FIG. 4A is a magnified, axial half-sectional view of FIG. 4.

To show the development of the structure as a function of the chosen degree of homogeneity, first FIGS. 4 and 4A illustrate an embodiment corresponding to $n_0 = 4$ which leads to $V_0 = 8.844$, i.e. a volume of material one half of the preceding volume and a homogeneity sphere ZI of radius 0.11. It can be seen in these FIGS. 4 and 4A that it is possible to dispense with the ring of opposite magnetization corresponding to the ring 3 in FIGS. 1 and 1A and that a corrector casing 110 of three rings 104, 105, 106 of alternate magnetizations is sufficient and could even be reduced to two rings 104, 105 at the cost of a very slight increase in volume. In FIGS. 4 and 4A, the main rings 101 and 102 correspond to the rings 1 and 2 in FIGS. 1 and 1A, and the lower opening of the device 124 corresponds to the opening 24 of the embodiment in FIGS. 1 and 1A.

Figure 5:
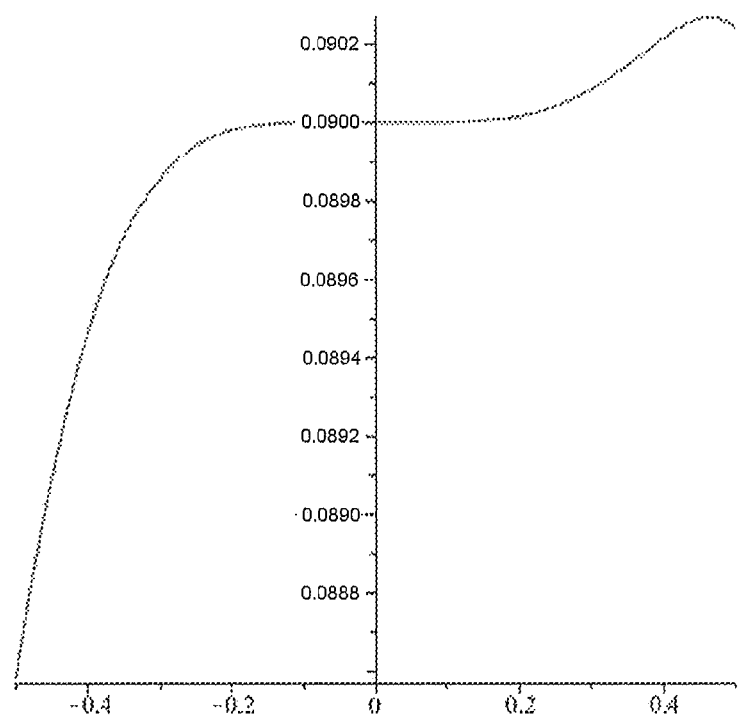
FIG. 5 shows the variation in the reduced magnetic field as a function of reduced dimension for the embodiment in FIGS. 4 and 4A.
Figure 6:
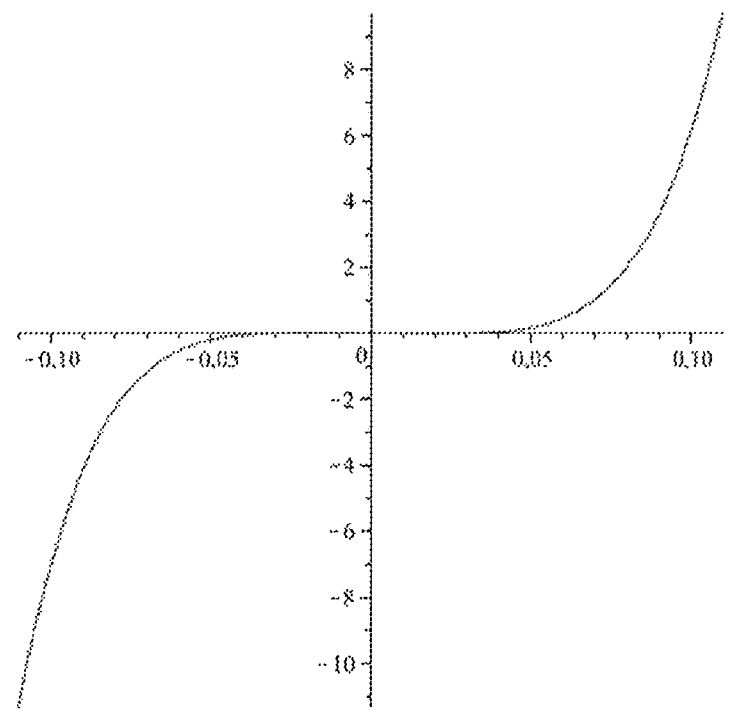
FIG. 6 shows the homogeneity of the magnetic field in ppm as a function of reduced dimension for the embodiment in FIGS. 4 and 4A.

FIGS. 5 and 6 relating to the embodiment in FIGS. 4 and 4A correspond to FIGS. 2 and 3 relating to the embodiment in FIGS. 1 and 1A.

Figure 7:
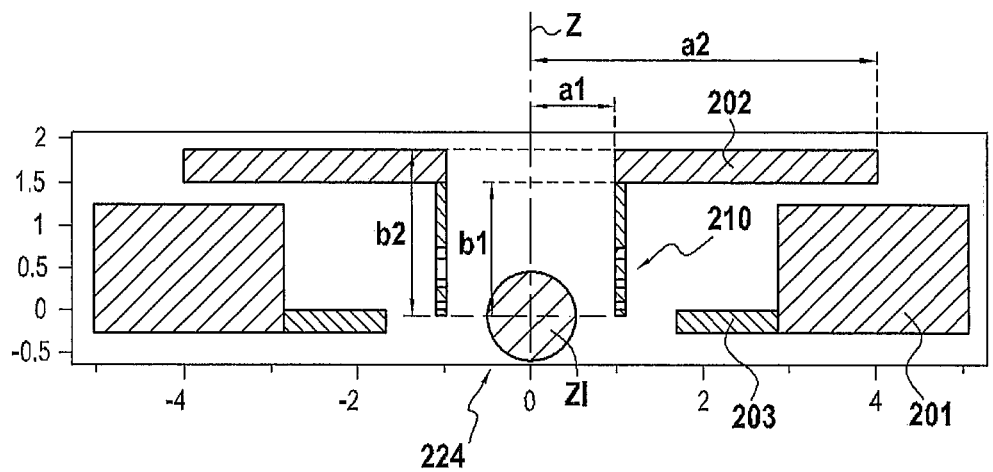
FIG. 7 is a schematic, axial sectional view of one particular embodiment of a permanent magnet device according to the invention with a seven-element corrector casing.
Figure 7A:
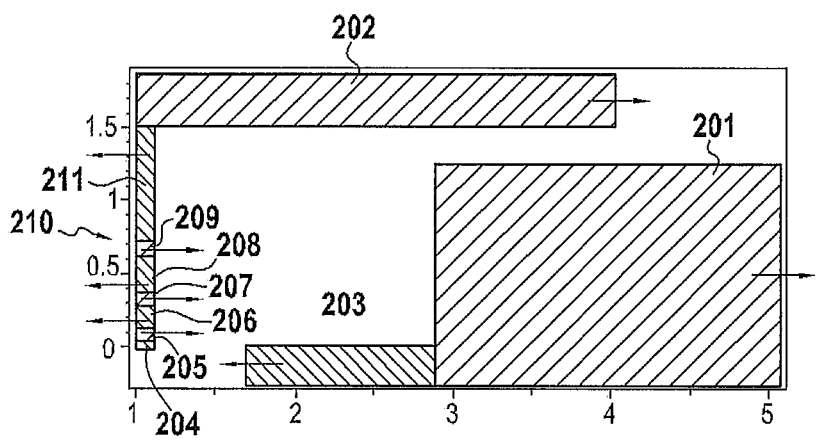
FIG. 7A is a magnified, axial half-sectional view of FIG. 7.

To illustrate a much larger degree of homogeneity, FIGS. 7 and 7A illustrate an embodiment corresponding to $n_0 = 11$, compatible with at least dodecagonal rings, which leads to $V_0 = 104.646$, i.e. a substantial volume of material but also a substantial sphere of homogeneity ZI of radius 0.5 centred at $-0.05$.

The embodiment shown in FIGS. 7 and 7A has main rings 201 and 202 respectively corresponding to the rings 1 and 2 in FIGS. 1 and 1A and to the rings 101 and 102 in FIGS. 4 and 4A. A corrector ring 203 can also be seen which corresponds to the ring 3 in FIGS. 1 and 1A, with radial magnetization oriented in opposite direction to the magnetization of the main rings 201 and 202.

In the embodiment shown FIGS. 7 and 7A, the cylindrical corrector casing 210 comprises seven superimposed supplementary rings 204, 205, 206, 207, 208, 209 and 211 in magnetic material with radial magnetization which, for each successive supplementary ring, is oriented alternately in opposite direction to the first direction of magnetization of the two main rings 201 and 202 (supplementary rings 204, 206, 208 and 211) and in this first direction (rings 205, 207 and 209).

Figure 8:
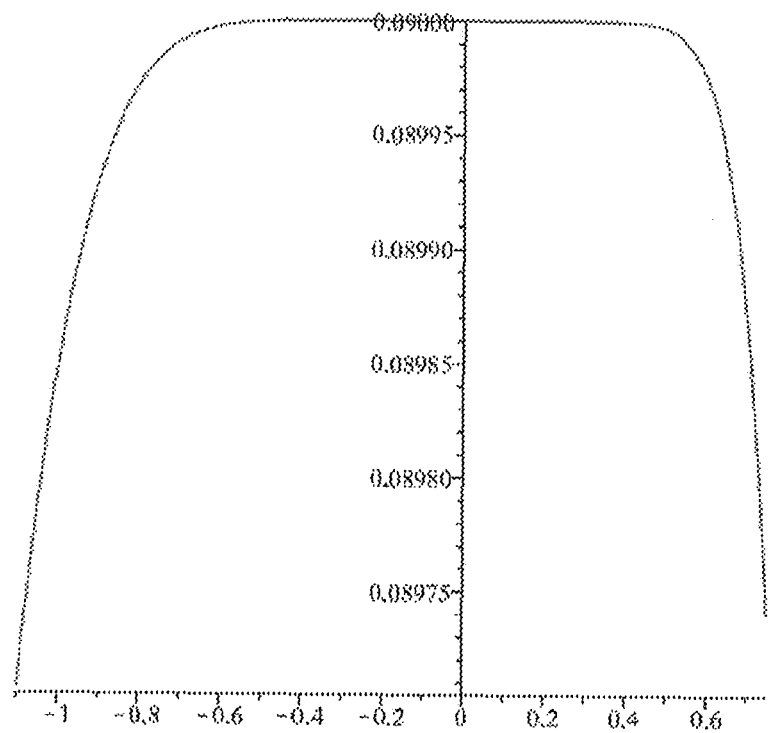
FIG. 8 shows the variation in the reduced magnetic field as a function of reduced dimension for the embodiment in FIGS. 7 and 7A.
Figure 9:
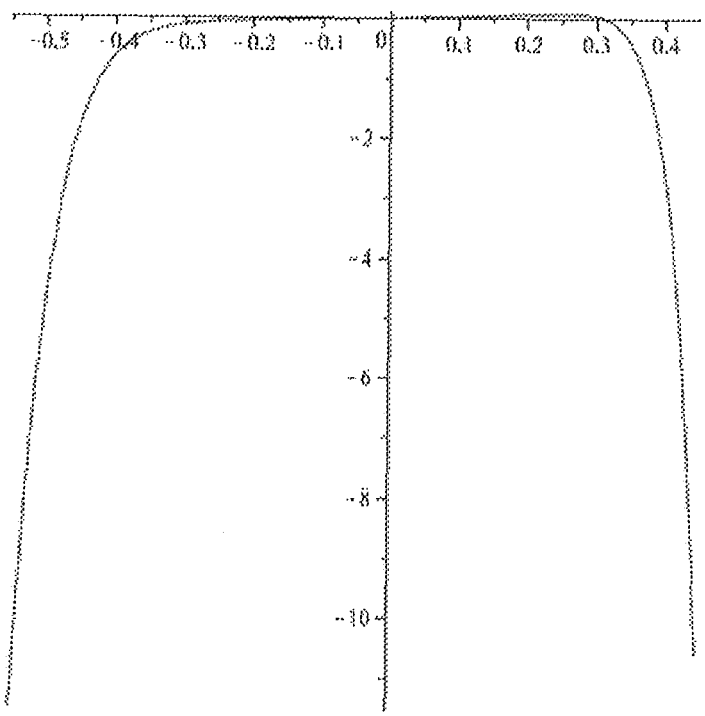
FIG. 9 shows the homogeneity of the magnetic field in ppm as a function of reduced dimension for the embodiment in FIGS. 7 and 7A.

FIGS. 8 and 9 relating to the embodiment in FIGS. 7 and 7A correspond to FIGS. 2 and 3 relating to the embodiment in FIGS. 1 and 1A, or to FIGS. 5 and 6 relating to the embodiment in FIGS. 4 and 4A.

In the different examples given with reference to FIGS. 1, 1A, 4, 4A, 7, 7A, it can be seen that the inner radius a2 (or a21) and the outer radius a2 (or a22) of the second main ring 2; 102; 202 are respectively smaller than the inner radius a1 (or a11) and the outer radius a2 (or a12) of the first main ring 1; 101; 201.

In the embodiment in FIGS. 1 and 1A, the rings 1, 2, 5, 7 and 9 illustrated by hatching with a first slant have radial magnetization oriented in a first direction (symbolized by arrows having a first orientation) whilst the rings 3, 4, 6 and 8 illustrated by hatching with a second slant have radial magnetization oriented in opposite direction to this first direction (symbolized by arrows oriented in opposite direction to the first orientation).

In the embodiment in FIGS. 4 and 4A, the rings 101, 102, 105 and 106 illustrated by hatching with a first slant have radial magnetization oriented in a first direction (symbolized by arrows oriented in a first direction) whilst the ring 104 illustrated by hatching with a second slant has radial magnetization oriented in opposite direction to this first direction (symbolized by an arrow oriented in opposite direction to the first orientation).

In the embodiment in FIGS. 7 and 7A, the rings 201, 202, 205, 207 and 209 illustrated by hatching with a first slant have radial magnetization oriented in a first direction (symbolized by arrows having a first orientation) whilst the rings 203, 204, 206, 208 and 211 illustrated by hatching with a second slant have radial magnetization oriented in opposite direction to this first direction (symbolized by an arrow having opposite orientation to the first orientation).

As already indicated above, according to one advantageous characteristic, the superimposed supplementary rings 4 to 9; 104 to 106; 204 to 209, 211 forming the cylindrical corrector casing 10; 110; 210 have the same inner radius and the same outer radius, and the cylindrical corrector casing 10; 110; 210 further comprises intercalary rings in non-magnetic material, to adjust the spacing (free space in the axial direction illustrated in FIGS. 1, 1A and 4, 4A) between the superimposed supplementary rings 4 to 9; 104 to 106; 204 to 209, 211 in magnetic material which themselves have radial magnetization which for each successive supplementary ring, is oriented alternately in opposite directions. In said cylindrical corrector casing 10; 110; 210, the supplementary ring 4; 104; 204 which is the closest to the opening 24; 124; 224 and to the zone of interest ZI has radial magnetization opposite that of the main ring 1; 101; 201 which extends around the opening 24; 124; 224 giving access to the zone of interest.

Figure 12:
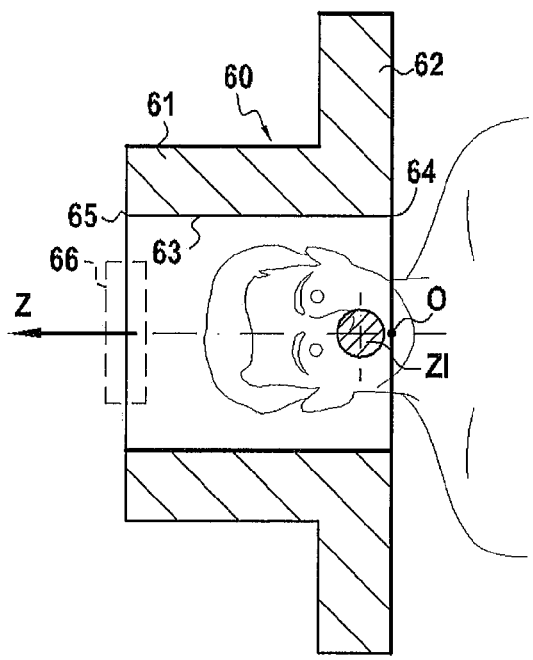

FIGS. 11 and 12 schematically illustrate a structure 50; 60 in the shape of a top hat according to the invention, able for example to symbolize the space taken up by one or other of the permanent magnet devices described with reference to FIGS. 1, 1A, 4, 4A, 7, 7A and having a rim 52; 62 defining an opening 54; 64 and a cylindrical chimney 51; 61 of axis Oz extending this opening 54; 64 and defining an inner cavity 53; 63 to allow the analysis of a patient's head or head portion.

In FIG. 11, a structure 50 is illustrated in vertical position with the opening 54 positioned at the bottom whilst in FIG. 12 a structure 60 is shown in horizontal position with the opening 64 positioned laterally.

Figure 13:
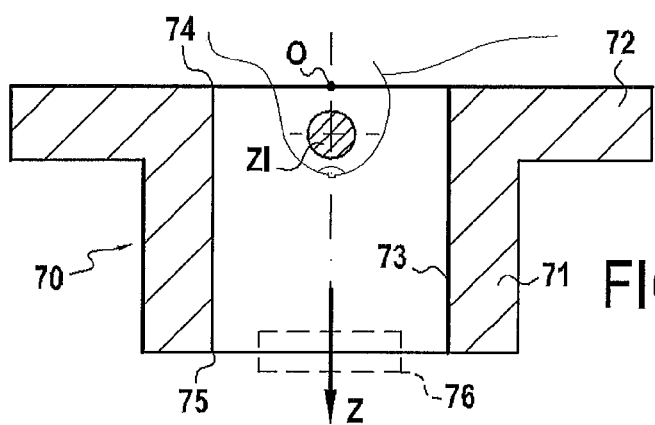
FIG. 13 is a schematic, axial sectional view showing an example of application of the device of the invention to a MRI mammography installation for observation of a patient's breast.

FIG. 13 shows a structure 70 similar to structures 50 and 60 but applied to a MRI mammography installation. The structure 70 is in the form of an inverted top hat having a rim 72 defining an upper opening 74 and a cylindrical well 71 of axis Oz extending this opening 74 and defining an inner cavity 73 to allow the analysis of a breast or breast portion of a patient lying face down, the breast hanging in the cavity 73 under the effect of gravity.

The structure 50; 60 or 70 representing the magnet device of the invention can have a fixed position and can be arranged facing a support carrying an object or a patient which can be moved relative to the permanent magnet device to bring the object or patient's organ along the axis Oz into the spherical zone of interest ZI, but according to one variant it is the structure 50; 60; 70 itself which may be mobile along the axis Oz to come to position itself relative to an object or part of a patient's body.

In the structure 50; 60 or 70, the bottom of the top hat i.e. the free space 55; 65; 75 at the centre of the second main ring 2; 102; 202 of the permanent magnet device, can remain open or it can be shut off at least partly by an additional cylindrical block (blocks 56, 66 and 76 represented by the dotted line in FIGS. 11, 12 and 13 respectively) in magnetic material either with radial magnetization which may or may not be oriented in the same direction as the direction of radial magnetization of the main rings 1, 2; 10, 102; 201, 202, or with axial magnetization along axis Oz.

The invention also concerns a method for producing a permanent magnet device for the creation of an offset homogeneous magnetic field with generation of a homogeneous magnetic field component Bz along an axis Oz in a spherical zone of interest ZI of centre O and radius r, comprising the following steps:

a) preparing and positioning at least one first main ring 1; 101; 201 in magnetic material with radial magnetization oriented in a first direction, having the axis Oz, a first inner radius a11, a first outer radius a12 and extending around an opening 24; 124; 224 giving access to the zone of interest ZI, b) preparing and positioning a second main ring 2; 102; 202 in magnetic material with radial magnetization oriented in the first direction, having the axis Oz, a second inner radius a21, a second outer radius a22 and offset along axis Oz from the first ring 1; 101; 201 and the zone of interest ZI, the second inner radius a21 and the second outer radius a22 of the second main ring 2; 102; 202 respectively being smaller than the first inner radius a11 and the first outer radius a12 of the first main ring 1; 101; 201, and c) preparing and positioning a cylindrical corrector casing 10; 110; 210 of axis Oz arranged between the first main ring 1; 101; 201 and the zone of interest ZI and between the second main ring 2; 102; 202 and the zone of interest ZI and comprising, starting from the vicinity of the opening 24; 124; 224, at least one first supplementary ring 4; 104; 204 in magnetic material with radial magnetization oriented in opposite direction to the first direction, and at least one second supplementary ring 5; 105; 205 in magnetic material with radial magnetization oriented in the first direction.

Also, to adjust the spacing between the supplementary rings 4 to 9; 104, 105; 204 to 209, 211 it is possible to intercalate intercalary rings in non-magnetic material inside the cylindrical corrector casing 10; 110; 210.

According to this method, at least some of the annular rings in magnetic material are made in the form of polygonal rings defined by circular cylinders approximated by polygonal lines and formed from an assembly of N identical right prisms 31 to 42 (see FIG. 10) of isosceles trapezoidal section.

The obtaining of a polygonal ring can be achieved using the following steps:

i) forming parallelepiped blocks by pressing or sintering, having a priority magnetization direction;

ii) cutting the parallelepiped blocks in the de-magnetized state to create prisms;

iii) magnetizing each of the prisms in the desired direction;

iv) assembling and bonding the prisms to create a polygonal ring.

In the drawings, corrector rings of different thicknesses are illustrated inside one same casing 10; 110; 210. To facilitate manufacture and to avoid difficult machining of magnetic material, it is possible to form corrector rings of different thicknesses from a stack of elementary corrector rings having radial magnetization in a given direction and having a single reduced thickness. Each corrector ring 4 to 9; 104 to 106; 204 to 209, 211 can therefore itself be made from a stack of elementary corrector rings having one or other of the directions of orientation of radial magnetization.

The invention claimed is:

1. A permanent magnet device for creating a homogeneous magnetic field to generate a homogeneous magnetic field component Bz along an axis Oz in a spherical zone of interest ZI of centre O and radius r, comprising at least one first main annular ring in magnetic material with radial magnetization oriented in a first direction, having said axis Oz, a first inner radius, a first outer radius and extending around an opening giving access to said zone of interest ZI, a second main annular ring in magnetic material with radial magnetization oriented in said first direction, having said axis Oz, a second inner radius, a second outer radius and offset along said axis Oz from said first ring and said zone of interest ZI, the second inner radius and the second outer radius of the second main ring respectively being smaller than the first inner radius and the first outer radius of the first main ring, and a cylindrical corrector assembly of axis Oz arranged between the first main ring and the zone of interest ZI and between the second main ring and the zone of interest ZI, and comprising, starting from the vicinity of said opening, at least one first supplementary annular ring in magnetic material with radial magnetization oriented in an opposite direction to said first direction, and at least one second supplementary annular ring in magnetic material with radial magnetization oriented in said first direction, wherein the superimposed supplementary rings forming said cylindrical corrector assembly have the same inner radius which is equal to the second inner radius of the second main annular ring and the same outer radius which is smaller than the first inner radius of the first main annular ring.

2. The permanent magnet device according to claim 1, further comprising an annular corrector ring of axis Oz in magnetic material with radial magnetization oriented in opposite direction to said first direction, arranged between said first main annular ring and said cylindrical corrector assembly.

3. The permanent magnet device according to claim 1, wherein the cylindrical corrector assembly comprises six superimposed supplementary rings in magnetic material with radial magnetization which, for each successive supplementary ring, is oriented alternately in opposite direction to said first direction and in said first direction.

4. The permanent magnet device according to claim 1, wherein said cylindrical corrector assembly further comprises intercalary rings in non-magnetic material to adjust the spacing between the superimposed supplementary rings in magnetic material with radial magnetization which, for each successive supplementary ring, is oriented alternately in opposite direction to said first direction and in said first direction.

5. The permanent magnet device according to claim 1, wherein at least some of the annular rings in magnetic material are formed by polygonal rings defined by circular cylinders approximated by polygonal lines and formed from an assembly of N identical right prisms having an isosceles trapezoidal base.

6. The permanent magnet device according to claim 5, wherein the first and second main rings are formed by polygonal rings comprising 8, 10 or 12 identical right prisms having an isosceles trapezoidal base.

7. The permanent magnet device according to claim 1, wherein it is applied to a NMR installation and is in the form of a top hat having a rim defining an opening and a cylindrical chimney of axis Oz extending said opening and defining an inner cavity to allow the analysis of a patient's head or head portion.

8. The permanent magnet device according to claim 7, wherein it is installed in a vertical position with the opening at the bottom.

9. The permanent magnet device according to claim 7, wherein it is installed in a horizontal position with the opening (64) positioned laterally.

10. The permanent magnet device according to claim 1, wherein it is applied to a MRI mammography installation and is in the form of an inverted top hat having a rim defining an upper opening and a cylindrical well of axis Oz extending said opening and defining an inner cavity to allow the analysis of a patient's breast or breast portion.

11. The permanent magnet device according to claim 1, wherein it is in a fixed position and arranged facing a support supporting an object or a patient able to be moved relative to said permanent magnet device to bring the object or the organ of the patient along the axis Oz into said spherical zone of interest ZI.

12. The permanent magnet device according to claim 1, wherein a free space in the centre of said second main annular ring is shut off at least partly by an additional cylindrical block in magnetic material with radial or axial magnetization.

13. A method for producing a permanent magnet device to create a homogeneous magnetic field with generation of a homogeneous magnetic field component Bz along an axis Oz in a spherical zone of interest ZI of centre O and radius r, comprising the following steps:
   a) preparing and positioning at least one first main annular ring in magnetic material with radial magnetization oriented in a first direction, having said axis Oz, a first inner radius, a first outer radius and extending around an opening giving access to said zone of interest ZI,
   b) preparing and positioning a second main annular ring in magnetic material with radial magnetization oriented in said first direction, having said axis Oz, a second inner radius, a second outer radius and offset along said axis Oz from said first annular ring and said zone of interest ZI, the second inner radius and the second outer radius of the second main annular ring respectively being smaller than the first inner radius and the first outer radius of the first main ring, and
   c) preparing and positioning a cylindrical corrector assembly of axis Oz arranged between the first main annular ring and the zone of interest ZI and between the second main annular ring and the zone of interest ZI and comprising starting from the vicinity of said opening, at least one first supplementary annular ring in magnetic material with radial magnetization oriented in opposite direction to said first direction, and at least one second additional annular ring in magnetic material with radial magnetization oriented in said first direction, the superimposed additional rings forming said cylindrical corrector assembly having the same inner radius which is equal to the second inner radius of the second main annular ring and the same outer radius which is smaller than the first inner radius of the first main annular ring.

14. The method according to claim 13, wherein to adjust the spacing between the supplementary rings intercalary rings in non-magnetic material are inserted in the cylindrical corrector assembly.

15. The method according to claim 13, wherein at least some of the annular rings in magnetic material are made in the form of polygonal rings defined by circular cylinders approximated by polygon lines and formed from an assembly of N identical right prisms having an isosceles trapezoidal base.

16. The method according to claim 15, wherein the forming of a polygonal ring is carried out using the following steps:
   i) forming parallelepiped blocks by pressing or sintering, having a priority magnetization direction;
   ii) cutting the parallelepiped blocks in the de-magnetized state to create prisms;
   iii) magnetizing each of the prisms in the desired direction;
   iv) assembling and bonding the prisms to create a polygonal ring.

* * * * *